United States Patent
Chiang et al.

(10) Patent No.: US 10,418,363 B2
(45) Date of Patent: *Sep. 17, 2019

(54) REPLACEMENT GATE PROCESS FOR FINFET

(71) Applicant: Taiwan Semiconductor Manufacturing Company, Ltd., Hsin-Chu (TW)

(72) Inventors: Hung-Li Chiang, Taipei (TW); Cheng-Yi Peng, Taipei (TW); Tsung-Yao Wen, Hsinchu (TW); Yee-Chia Yeo, Hsinchu (TW); Yen-Ming Chen, Hsin-Chu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/195,162

(22) Filed: Nov. 19, 2018

(65) Prior Publication Data
US 2019/0109134 A1 Apr. 11, 2019

Related U.S. Application Data

(60) Continuation of application No. 15/415,641, filed on Jan. 25, 2017, now Pat. No. 10,153,280, which is a division of application No. 14/928,704, filed on Oct. 30, 2015, now Pat. No. 9,570,580.

(51) Int. Cl.
*H01L 27/092* (2006.01)
*H01L 29/66* (2006.01)
(Continued)

(52) U.S. Cl.
CPC .... *H01L 27/0924* (2013.01); *H01L 21/31055* (2013.01); *H01L 21/76224* (2013.01);
(Continued)

(58) Field of Classification Search
CPC ......... H01L 21/31055; H01L 21/76224; H01L 21/823431; H01L 21/823437;
(Continued)

(56) References Cited

U.S. PATENT DOCUMENTS 6,864,164 B1 3/2005 Dakshina-Murthy et al.
7,074,662 B2 7/2006 Lee et al.
(Continued)

FOREIGN PATENT DOCUMENTS

CN 102157554 8/2011
CN 102683192 9/2012

*Primary Examiner* — Bac H Au
(74) *Attorney, Agent, or Firm* — Haynes and Boone, LLP

(57) ABSTRACT

A method of forming a semiconductor device includes etching a substrate to form two first trenches separated by a fin; filling the two first trenches with an isolation layer; and depositing a dielectric layer over the fin and the isolation layer. The method further includes forming a second trench in the dielectric layer over a channel region of the semiconductor device, the second trench exposing the isolation layer. The method further includes etching the isolation layer through the second trench to expose an upper portion of the fin in the channel region of the semiconductor device, and forming a dummy gate in the second trench over the isolation layer and engaging the upper portion of the fin.

20 Claims, 17 Drawing Sheets

(51) Int. Cl.
   *H01L 29/78*      (2006.01)
   *H01L 21/3105*    (2006.01)
   *H01L 21/762*     (2006.01)
   *H01L 21/8234*    (2006.01)
   *H01L 21/8238*    (2006.01)
   *H01L 29/06*      (2006.01)
   *H01L 29/08*      (2006.01)

(52) U.S. Cl.
   CPC ........... *H01L 21/823431* (2013.01); *H01L 21/823437* (2013.01); *H01L 21/823481* (2013.01); *H01L 21/823814* (2013.01); *H01L 21/823821* (2013.01); *H01L 21/823878* (2013.01); *H01L 29/0653* (2013.01); *H01L 29/0847* (2013.01); *H01L 29/6656* (2013.01); *H01L 29/66545* (2013.01); *H01L 29/66795* (2013.01); *H01L 29/7851* (2013.01)

(58) Field of Classification Search
   CPC ..... H01L 21/823481; H01L 21/823814; H01L 21/823821; H01L 21/823878; H01L 27/0924; H01L 29/0653; H01L 29/0847; H01L 29/66545; H01L 29/6656; H01L 29/66795; H01L 29/7851; H01L 29/785; H01L 27/0886; H01L 29/6681
   See application file for complete search history.

(56) References Cited

U.S. PATENT DOCUMENTS

| | | | |
|---|---|---|---|
| 8,048,733 B2 | 11/2011 | Yeh et al. | |
| 8,487,378 B2 | 7/2013 | Goto et al. | |
| 8,697,501 B1 | 4/2014 | Choi et al. | |
| 8,729,634 B2 | 5/2014 | Shen et al. | |
| 8,748,989 B2 | 6/2014 | Lin et al. | |
| 8,826,213 B1 | 9/2014 | Ho et al. | |
| 8,887,106 B2 | 11/2014 | Ho et al. | |
| 8,912,063 B2 | 12/2014 | Kim et al. | |
| 9,153,692 B2 | 10/2015 | Kim et al. | |
| 9,276,087 B2 | 3/2016 | Kim et al. | |
| 9,324,850 B2 | 4/2016 | Kang et al. | |
| 9,337,318 B2 | 5/2016 | Liu et al. | |
| 9,349,651 B2 | 5/2016 | Kim et al. | |
| 9,412,641 B1 | 8/2016 | Guo et al. | |
| 9,418,994 B1 | 8/2016 | Chao et al. | |
| 9,425,317 B1 | 8/2016 | Wen et al. | |
| 10,153,280 B2 * | 12/2018 | Chiang | H01L 29/0847 |
| 2005/0019993 A1 | 1/2005 | Lee et al. | |
| 2005/0056892 A1 | 3/2005 | Seliskar | |
| 2005/0227435 A1 | 10/2005 | Oh et al. | |
| 2010/0276756 A1 | 11/2010 | Rachmady et al. | |
| 2012/0280250 A1 | 11/2012 | Basker et al. | |
| 2014/0239255 A1 | 8/2014 | Kang et al. | |
| 2014/0335673 A1 | 11/2014 | Kim et al. | |
| 2016/0093726 A1 | 3/2016 | Ching et al. | |
| 2016/0204215 A1 | 7/2016 | Chang et al. | |
| 2016/0204245 A1 | 7/2016 | JangJian et al. | |
| 2016/0204260 A1 | 7/2016 | Ching | |
| 2016/0225906 A1 | 8/2016 | Wang et al. | |
| 2016/0233298 A1 | 8/2016 | Webb et al. | |
| 2016/0240650 A1 | 8/2016 | Chang et al. | |
| 2016/0247919 A1 | 8/2016 | Akarvardar | |
| 2016/0254261 A1 | 9/2016 | Machkaoutsan et al. | |
| 2016/0268312 A1 | 9/2016 | Wang et al. | |
| 2017/0133487 A1 | 5/2017 | Chiang et al. | |

* cited by examiner

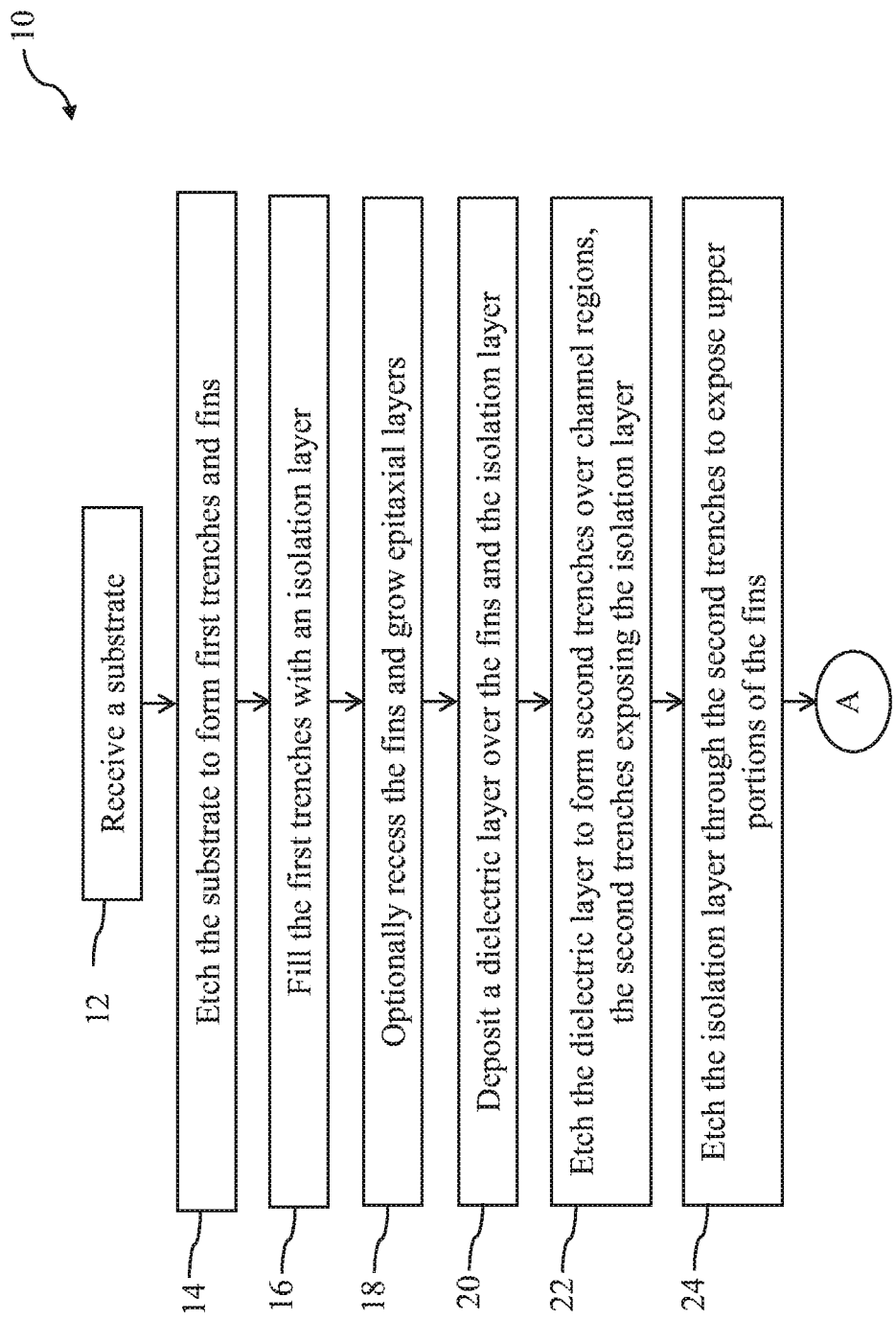

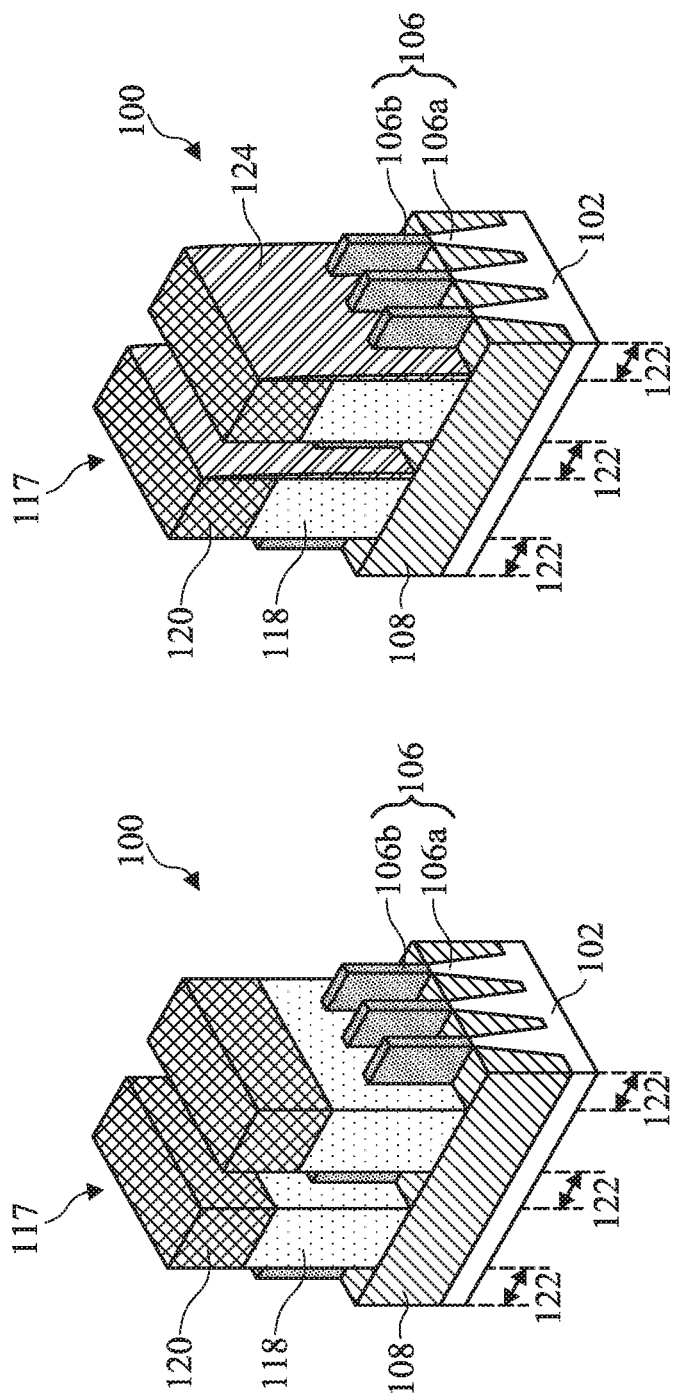

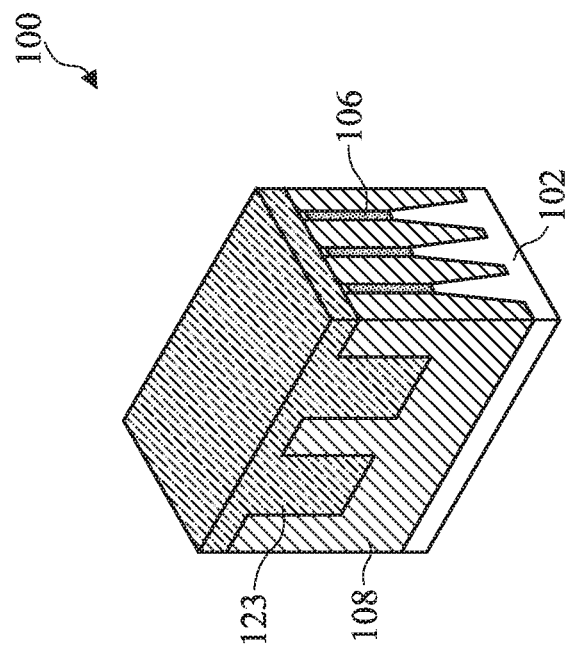
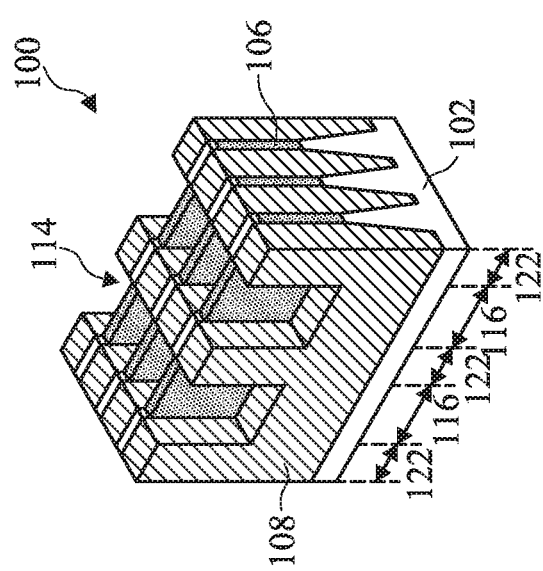
FIG. 3A
FIG. 3B

REPLACEMENT GATE PROCESS FOR FINFET

PRIORITY DATA

The present application is a continuation application of U.S. application Ser. No. 15/415,641, filed Jan. 25, 2017, which is a divisional application of U.S. application Ser. No. 14/928,704, filed Oct. 30, 2015, each of which is hereby incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

For example, multi-gate devices have been introduced in an effort to improve gate control by increasing gate-channel coupling, reduce OFF-state current, and reduce short-channel effects (SCEs). One type of multi-gate devices is FinFETs—transistors with a fin-like semiconductor channel ("fin") and a gate electrode engaging the fin on two or three sides thereof. A further advancement in FinFET is the replacement of the typically poly silicon gate electrode with a metal gate electrode to improve device performance. This is termed a "replacement gate" or "gate last" process in which a dummy gate (e.g., a poly silicon gate) is fabricated over the fin and is replaced with a final gate stack (e.g., a metal gate) in later fabrication steps. This allows for reduced number of subsequent processes, including high temperature processing, that is performed after the formation of the final gate stack. However, there are challenges to implementing such IC fabrication processes, especially with scaled down IC features in advanced process nodes. One challenge is that after the fin is formed and before the dummy gate is formed, the fin may suffer from buckling and collapsing during cleaning and drying processes due to its high aspect ratio (a ratio of fin height over fin width).

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 1A, 1B, 1C, and 1D are flow charts of a method of forming a semiconductor device according to various aspects of the present disclosure.

FIGS. 2A, 2B, 2C, 2D, 2E, 2F, 2G, 2H, 2I, 2J, 2K, 2L, 2M, 2N, 2O, and 2P are perspective views of a portion of a semiconductor device in various fabrication stages according to the method in FIGS. 1A-1D, in accordance to an embodiment.

FIGS. 3A, 3B, 3C, 3D, 3E, and 3F are perspective views of a portion of a semiconductor device in various fabrication stages according to the method in FIGS. 1A-1D, in accordance to another embodiment.

DETAILED DESCRIPTION

Figure 1B:
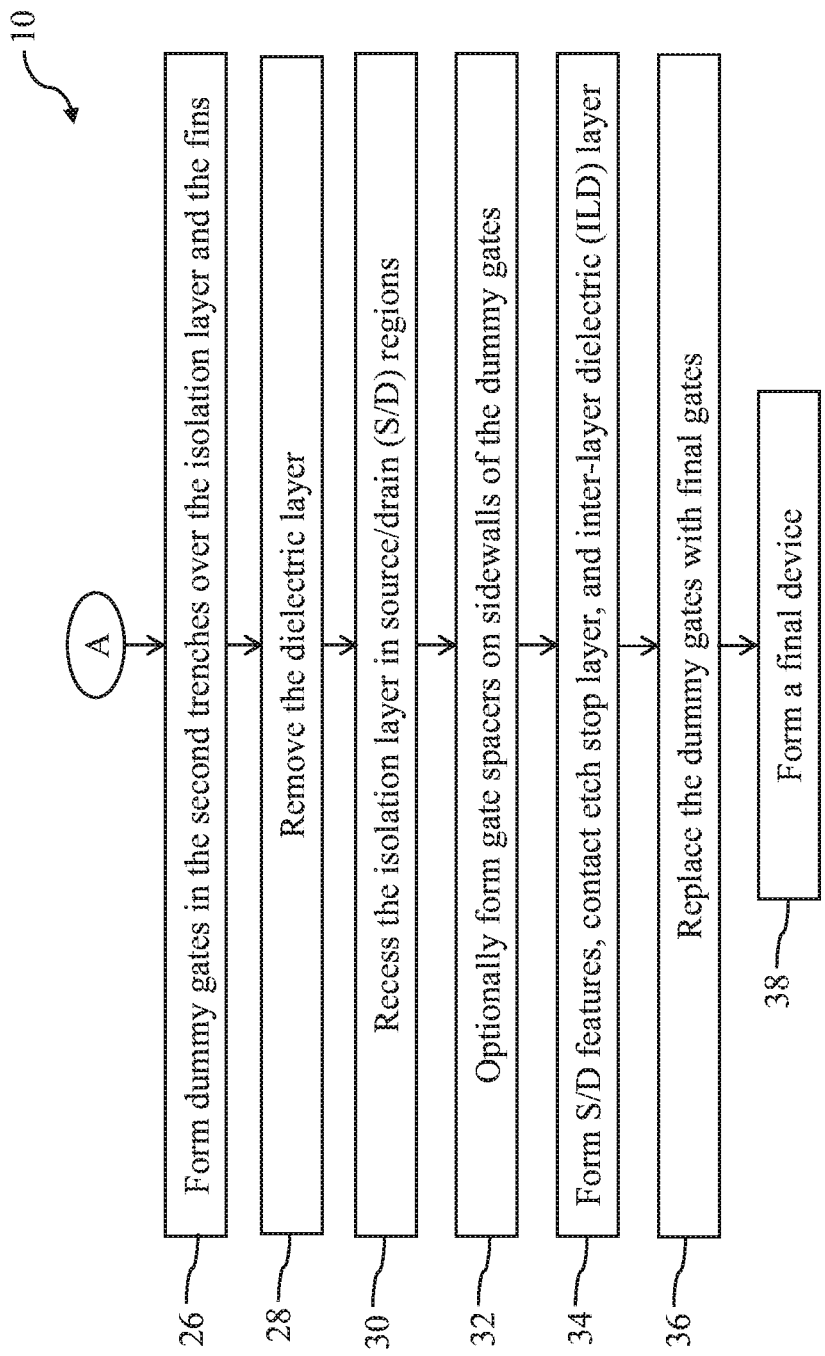

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to methods for semiconductor device fabrication, and more particularly to methods of forming FinFETs using a replacement gate process. In a typical FinFET replacement gate process, a plurality of fins is formed over a substrate through patterning and cleaning processes. Then, a dummy gate is formed over the substrate and engaging the plurality of fins. After some fabrication steps, such as the formation of doped source/drain (S/D) features, the dummy gate is replaced by an actual gate including metal layers. One problem with such a replacement gate process is that the plurality of fins is left free-standing on the substrate through one or more cleaning processes before the formation of the dummy gate. The one or more cleaning processes may include a wet cleaning process with a solvent having high surface tension followed by a spin drying process. Due to the lack of support and protection, the free-standing fins may buckle or collapse during the one or more cleaning processes. This problem is more severe with fins that have a high aspect ratio (e.g., an aspect ratio greater than 9). Embodiments of the present disclosure provide solutions to the above issue. Although the present disclosure discusses embodiments in terms of FinFETs, the inventive concepts can be applied to other type of devices, including other types of multi-gate devices, such as horizontal gate-all-around devices having a nanowire channel. One of ordinary skill may recognize other examples of semiconductor devices that may benefit from aspects of the present disclosure.

FIGS. 1A, 1B, 1C, and 1D show flow charts of a method 10 of forming a semiconductor device 100 using a replacement gate process, according to various aspects of the present disclosure. The method 10 is merely an example, and is not intended to limit the present disclosure beyond what is explicitly recited in the claims. Additional operations can be provided before, during, and after the method 10, and some operations described can be replaced, eliminated, or moved around for additional embodiments of the method. The method 10 is described below in conjunction with FIGS. 2A-2P and 3A-3F, which show perspective views of a portion of the semiconductor device 100 in intermediate stages of fabrication.

Figure 2B:
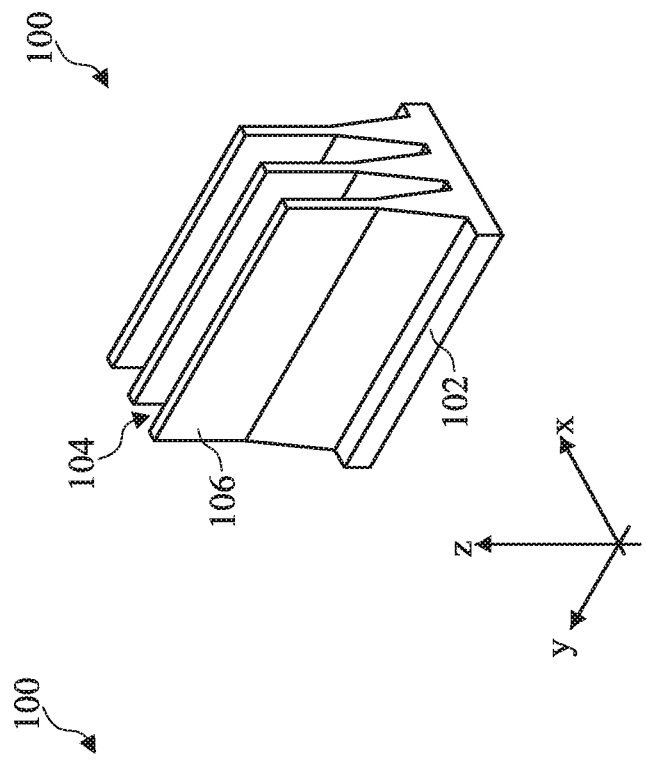
Figure 2A:
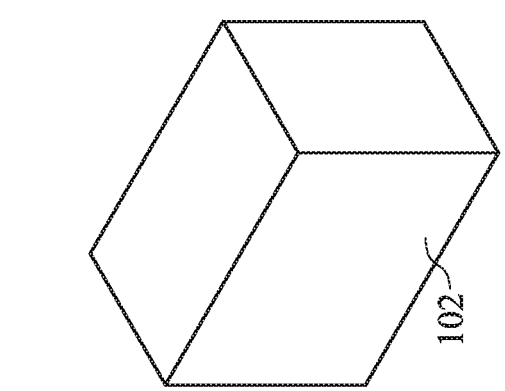

At operation 12, the method 10 (FIG. 1A) receives a substrate 102. Referring to FIG. 2A, in embodiments, the substrate 102 may be a semiconductor substrate such as a silicon wafer. The substrate 102 may also include other semiconductors such as germanium, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof. Further, the substrate 102 may optionally include epitaxial layers, be strained for performance enhancement, include a silicon-on-insulator structure, and/or have other suitable enhancement features.

At operation 14, the method 10 (FIG. 1A) etches the substrate 102 to form trenches 104 therein. Referring to FIG. 2B, portions of the substrate 102 are removed to form the trenches 104, and one or more fins 106 are thereby formed with remaining portions of the substrate 102. The one or more fins 106 extend from a bottom portion of the substrate 102, and interpose the trenches 104. In an embodiment, operation 14 includes a patterning process. For example, the patterning process forms a masking element over the substrate 102 through a photolithography process. The photolithography process may include forming a photoresist (or resist) over the substrate 102, exposing the resist to a pattern that defines the shapes for the fins 106 (or the trenches 104) from a top view, performing post-exposure bake processes, and developing the resist to form the masking element. The operation 14 further includes an etching process where the substrate 102 is etched through the masking element to form the trenches 104. The etching processes may include one or more dry etching processes, wet etching processes, and other suitable etching techniques. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. The one or more etching processes form the trenches 104 in the substrate 102, leaving portions of the un-etched substrate 102 as the fins 106. The masking element is subsequently removed, for example, by a stripping process. In an embodiment, the fins 106 have a high aspect ratio, which is the ratio between the height (along the "z" direction) and the width (along the "x" direction) of the fins 106. For example, the aspect ratio of the fins 106 may exceed 9.

Figure 2D:
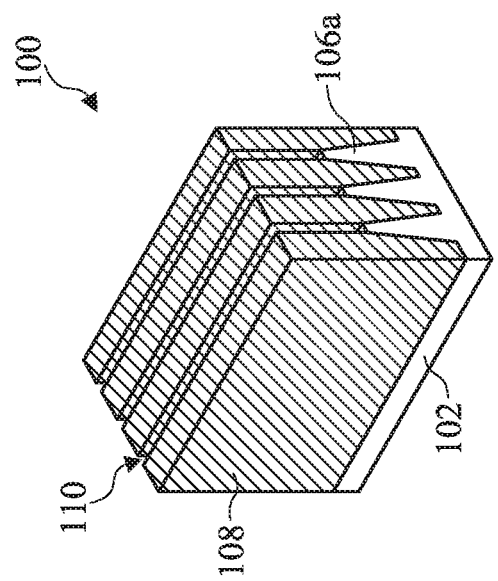
Figure 2C:
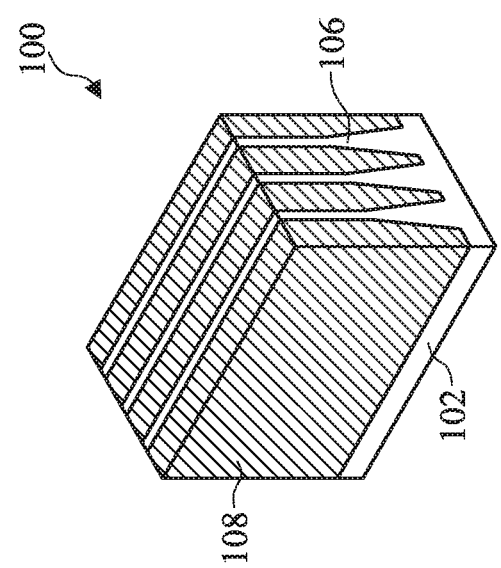

At operation 16, the method 10 (FIG. 1A) fills the trenches 104 with an isolation layer 108. Referring to FIG. 2C, the isolation layer 108 includes a dielectric material, such as silicon oxide, which electrically isolate the fins 106 from each other. The isolation layer 108 may be formed by chemical vapor deposition (CVD), plasma enhanced CVD (PECVD), physical vapor deposition (PVD), thermal oxidation, or other techniques. In an embodiment, after the isolation layer 108 is deposited, a chemical mechanical planarization (CMP) process is performed to planarize a top surface of the isolation layer 108 and to expose top surfaces of the fins 106. As a result, the top surface of the isolation layer 108 and the top surfaces of the fins 106 are co-planar.

Figure 2E:
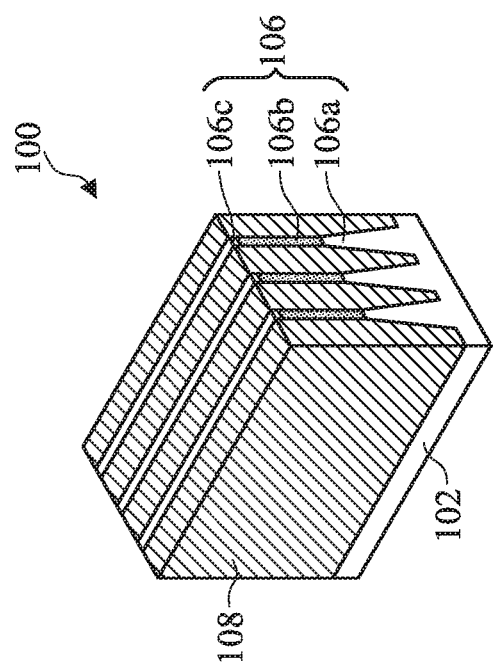

At operation 18, the method 10 (FIG. 1A) optionally recesses the fins 106 and grows one or more epitaxial layers as an upper portion of the fins 106. This may involve multiple steps as shown in FIGS. 2D and 2E. Referring to FIG. 2D, the device 100 is etched in a selective etching process where the fins 106 are etched while the isolation layer 108 remains substantially unchanged. As a result, trenches 110 are formed in the device 100. Various portions of the isolation layer 108 act as sidewalls of the trenches 110. The remaining portions of the fins 106 are labeled as 106a, which act as the floor of the trenches 110. The etching process may include dry etching, wet etching, or other suitable etching techniques.

Referring to FIG. 2E, epitaxial features 106b and 106c are grown in the trenches 110 atop the original fins 106a. The features 106b and 106c and the original fins 106a make up the fins 106 for the subsequent fabrication stages. In an embodiment, the feature 106b may include one or more semiconductor layers, each of which may be grown by a molecular beam epitaxy (MBE) process, a chemical vapor deposition (CVD) process such as a metal organic CVD (MOCVD) process, and/or other suitable epitaxial growth processes. Each semiconductor layer of the feature 106b may include silicon, germanium, a compound semiconductor, or an alloy semiconductor, and may be doped or undoped. The feature 106c is an epitaxial hardmask layer in the present embodiment, and may be omitted in an alternative embodiment. The feature 106c has a slower etching rate than the feature 106b and can protect the semiconductor layer(s) of the feature 106b in subsequent processes. In an embodiment, after the epitaxial features 106b and 106c are grown, a CMP process is performed to planarize top surfaces of the isolation layer 108 and the features 106c/106b. The operation 18 is optional—in an alternative embodiment, the steps shown in FIGS. 2D and 2E are not performed.

Figure 2F:
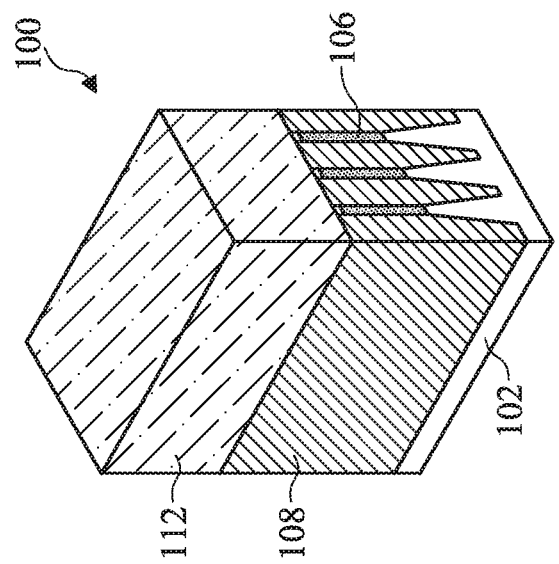

At operation 20, the method 10 (FIG. 1A) deposits a dielectric layer 112 over the isolation layer 108 and the fins 106. Referring to FIG. 2F, the dielectric layer 112 may include materials such as tetraethylorthosilicate oxide, un-doped silicate glass, or doped silicon oxide such as borophosphosilicate glass, fused silica glass, phosphosilicate glass, boron doped silicon glass, and/or other suitable dielectric materials. The dielectric layer 112 may be deposited by a PECVD process or other suitable deposition techniques. In an embodiment, the dielectric layer 112 will be completely removed in subsequent fabrication stages. Therefore it is also called a dummy dielectric layer 112.

Figure 2G:
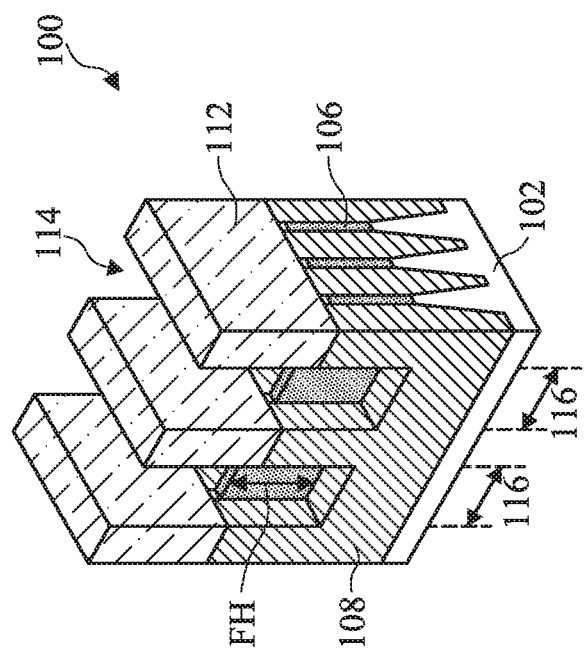

At operation 22, the method 10 (FIG. 1A) forms trenches 114 in the dielectric layer 112. Referring to FIG. 2G, the trenches 114 are formed over channel regions 116 of the device 100. The channel regions 116 correspond to the regions of transistor channels where gate electrodes are to be formed. In an embodiment, operation 22 includes a photolithography process and an etching process. For example, the photolithography process forms a masking element over the dielectric layer 112. Then, the dielectric layer 112 is etched through the masking element using a dry etching process or a wet etching process that selectively removes the material(s) of the dielectric layer 112 but not the isolation layer 108 and the fins 106. As a result, the top surfaces of the isolation layer 108 and the fins 106 are exposed through the trenches 114. The masking element may be subsequently removed.

Figure 2H:
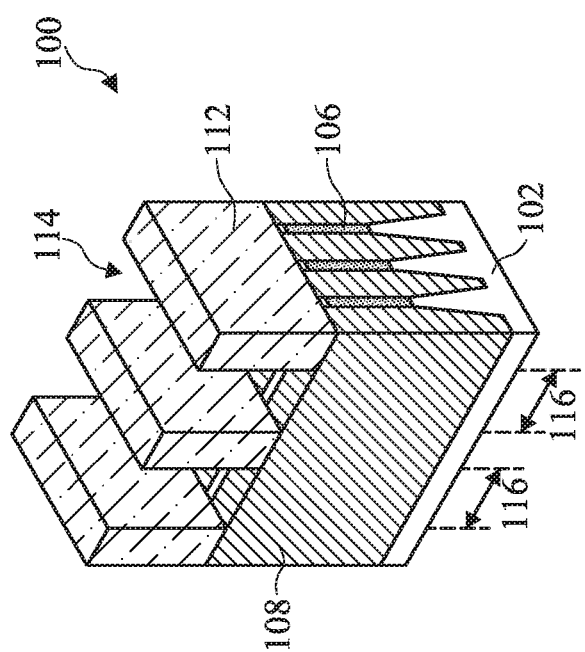

At operation 24, the method 10 (FIG. 1A) etches the isolation layer 108 through the trenches 114 to expose upper portions of the fins 106. Referring to FIG. 2H, the trenches 114 extend into the isolation layer 108 such that the upper portions of the fins 106 reach a desired height FH. Further, the epitaxial feature 106c (FIG. 2E) are removed in the channel regions 116 during the etching process. In an embodiment, the etching process is a dry etching process that is tuned to selectively remove the isolation layer 108 while the dielectric layer 112 and the fins 106 (at least the features 106b and 106a) remain substantially unchanged. In an embodiment, the fins 106 may be cleaned, for example, using a wet cleaning solution followed by a spin drying process. Since the fins 106 are supported by the isolation layer 108 in various portions, they do not suffer buckling or collapsing issues as discussed earlier with respect to traditional replacement gate processes. In an embodiment, the upper portions of the fins 106 may be passivized to form a thin passivation layer.

Figure 1C:
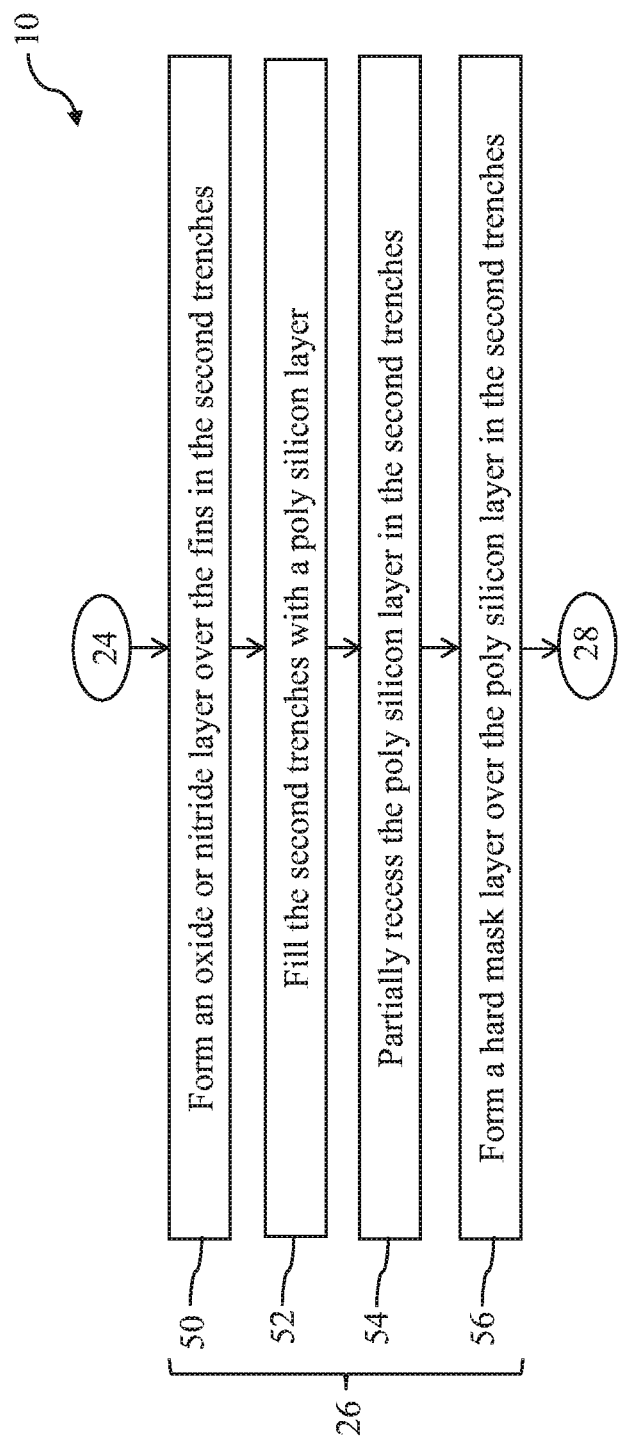
Figure 1D:
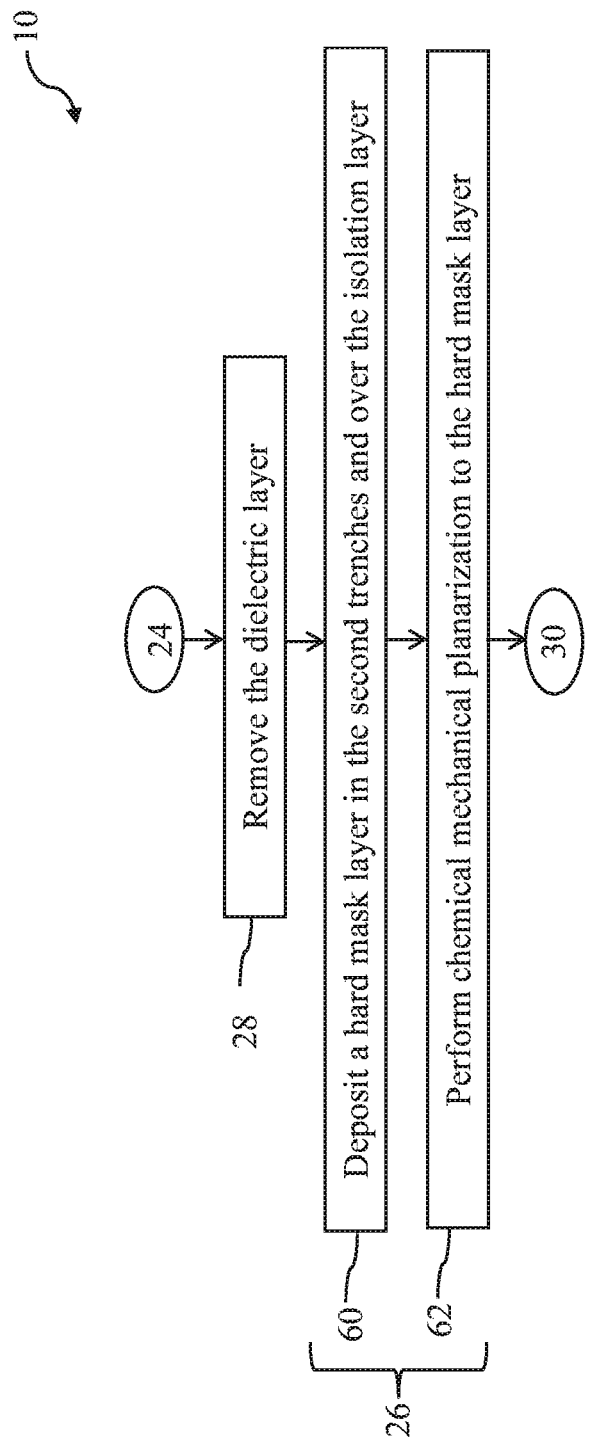

At operation 26, the method 10 (FIG. 1B) forms dummy gates 117 (see FIGS. 2L and 3C) in the trenches 114 and engaging the upper portions of the fins 106. At operation 28, the method 10 (FIG. 1B) removes the dielectric layer 112 from the device 100 (or at least from S/D regions of the device 100). Operations 26 and 28 may be executed in different orders in various embodiments. Operation 26 further involves multiple steps. In the following, operations 26 and 28 are discussed using two embodiments of the present disclosure. The first embodiment is illustrated in FIG. 1C in conjunction with FIGS. 2I-2M. The second embodiment is illustrated in FIG. 1D in conjunction with FIGS. 3A-3C. One of ordinary skill may recognize other embodiments from aspects of the present disclosure.

In the first embodiment, operation 26 follows operation 24 and includes operations 50, 52, 54, and 56 (FIG. 1C). At operation 50, the method 10 (FIG. 1C) forms an oxide or nitride layer (e.g., silicon oxide, silicon nitride, or silicon oxynitride) over the fins 106 in the second trenches 114. The oxide or nitride layer may be formed by chemical oxidation, thermal oxidation, atomic layer deposition (ALD), chemical vapor deposition (CVD), and/or other suitable methods. In an embodiment, the oxide or nitride layer is a thin and conformal layer.

Figure 2J:
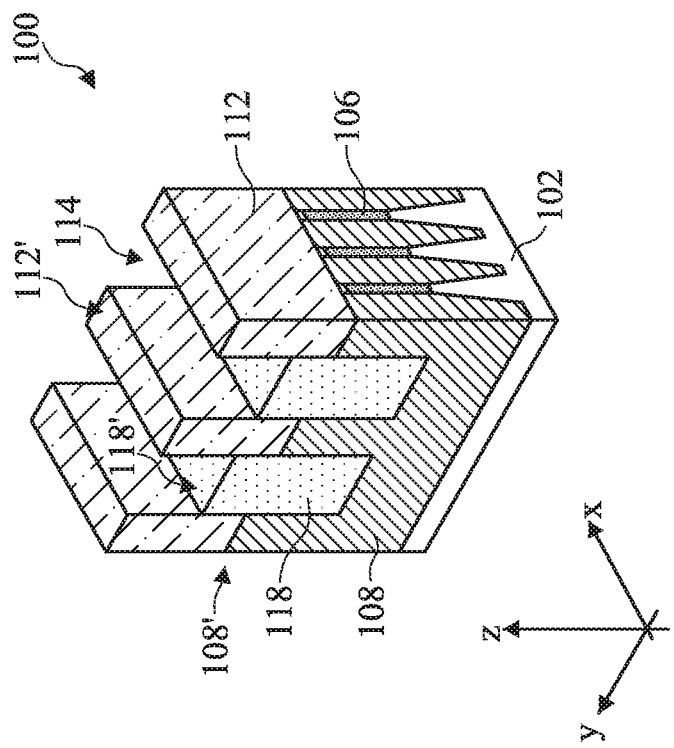
Figure 2I:
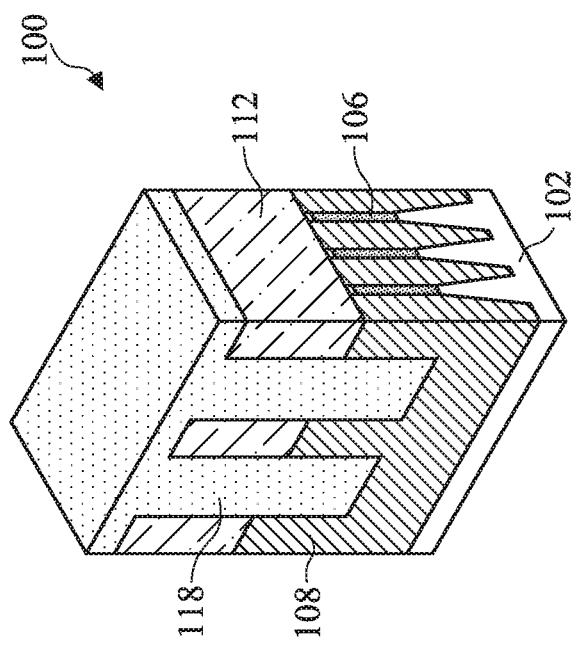

At operation 52, the method 10 (FIG. 1C) fills the trenches 114 with a poly silicon layer 118. Referring to FIG. 2I, the poly silicon layer 118 is deposited in the trenches 114 over the oxide or nitride layer (not shown) over the upper portions of the fins 106. FIG. 2I further shows that the poly silicon layer 118 overfills the trenches 114 and is disposed over the top surfaces of the dielectric layer 112. In an embodiment, the poly silicon layer 118 is formed by low-pressure chemical vapor deposition (LPCVD), plasma-enhanced CVD (PECVD), or other suitable deposition processes.

At operation 54, the method 10 (FIG. 1C) partially recesses the poly silicon layer 118 into the trenches 114. Referring to FIG. 2J, the poly silicon layer 118 is recessed such that a top surface 118' of the poly silicon layer 118 is below a top surface 112' of the dielectric layer 112, but above a top surface 108' of the isolation layer 108. In an embodiment, the depth of the trenches 114 (from 118' to 112' along the "z" direction) is about one third of the height of the dummy gate 117 (see FIG. 2L). In the present embodiment, this depth is controlled by timer for the etching process in the operation 54.

Figure 2L:
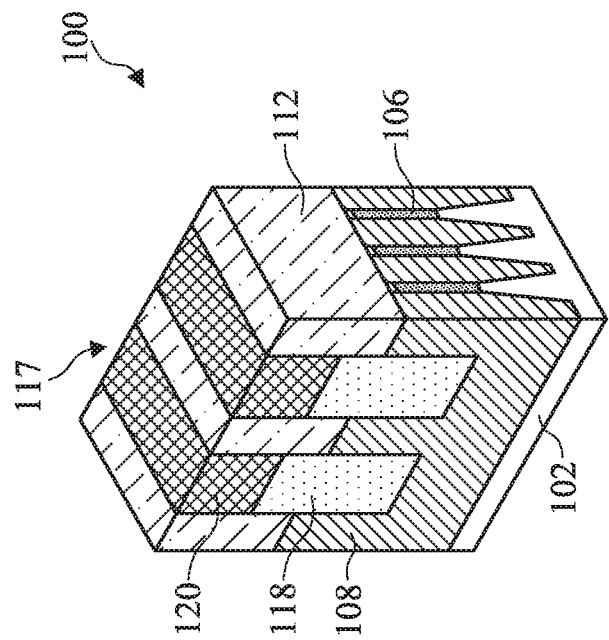
Figure 2K:
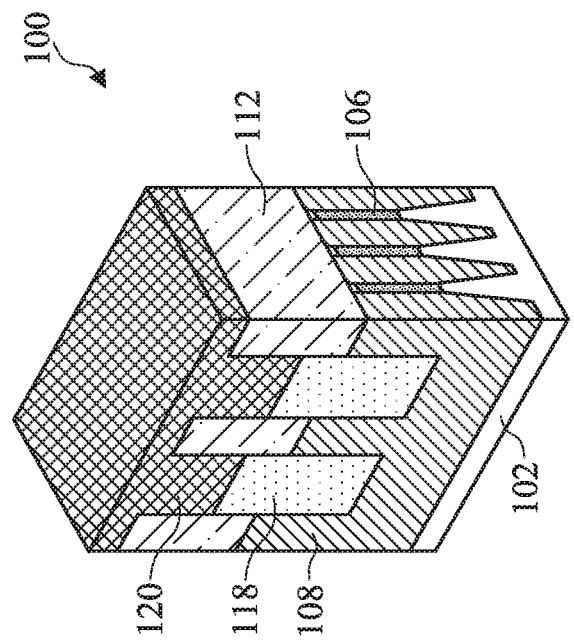

At operation 56, the method 10 (FIG. 1C) forms a hard mask layer 120 in the trenches 114. Referring to FIG. 2K, the hard mask layer 120 is deposited as a blanket layer over the device 100 and overfilling the trenches 114. In embodiments, the hard mask layer 120 provides etching selectivity with respect to the dielectric layer 112 and/or the isolation layer 108. In an embodiment, the hard mask layer 120 includes a nitride, such as silicon nitride, silicon oxynitride, and silicon oxycarbon nitride. In an alternative embodiment, the hard mask layer 120 includes other types of dielectric layer suitable for hard mask purposes, such as silicon oxide. The hard mask layer 120 may be formed by chemical oxidation, thermal oxidation, ALD, CVD, and/or other suitable techniques. Referring to FIG. 2L, a CMP process is performed to remove the hard mask layer 120 outside the trenches 114 and to planarize a top surface of the device 100. As shown in FIG. 2L, the dummy gate 117 includes the hard mask layer 120, the poly silicon layer 118, and the oxide or nitride layer (not shown) underneath the poly silicon layer 118 in this embodiment.

Figure 2M:
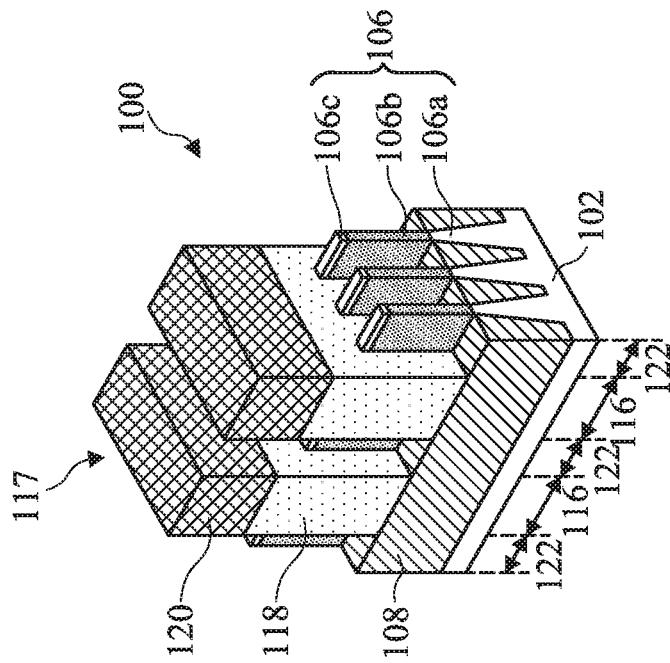

Following operation 56, the method 10 (FIG. 1C) removes the dielectric layer 112 in operation 28. Referring to FIGS. 2L and 2M, the dielectric layer 112 is removed from at least source/drain (S/D) regions 122 of the device 100. The dielectric layer 112 may be removed by an etching process tuned to selectively remove the dielectric layer 112 while the dummy gate 117, the isolation layer 108, and the fins 106 remain substantially unchanged.

In the second embodiment, operation 26 follows operation 28 and includes operations 60 and 62 (FIG. 1D). Referring to FIGS. 2H and 3A, the dielectric layer 112 is removed from at least the S/D regions 122 of the device 100 while the upper portions of the fins 106 are still exposed through the trenches 114. The dielectric layer 112 may be removed by an etching process tuned to selectively remove the dielectric layer 112 while the isolation layer 108 and the fins 106 remain substantially unchanged. The upper portions of the fins 106 may be cleaned subsequently.

Figure 3D:
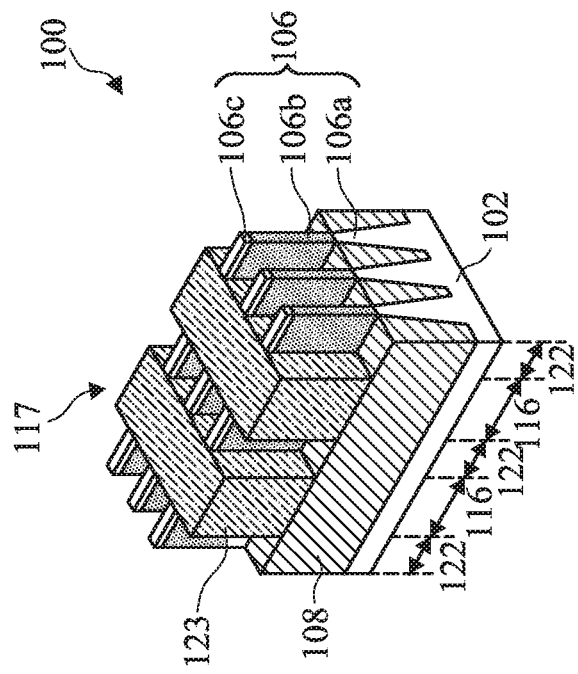
Figure 3C:
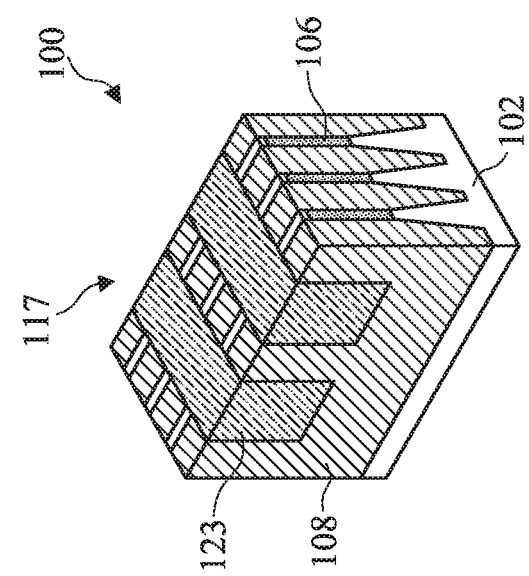

At operation 60, the method 10 (FIG. 1D) forms a hard mask layer 123 in the trenches 114. Referring to FIG. 3B, the hard mask layer 123 is deposited over the isolation layer 108 and engaging the upper portions of the fins 106. In the present embodiment, the hard mask layer 123 overfills the trenches 114 and is disposed over the top surfaces of the isolation layer 108. In embodiments, the hard mask layer 123 provides etching selectivity with respect to the isolation layer 108. In an embodiment, the hard mask layer 123 includes a nitride, such as silicon nitride, silicon oxynitride, and silicon oxycarbon nitride. In an alternative embodiment, the hard mask layer 123 includes other types of dielectric layer suitable for hard mask purposes, such as silicon oxide. The hard mask layer 123 may be formed by chemical oxidation, thermal oxidation, ALD, CVD, and/or other suitable techniques. At operation 62, the method 10 (FIG. 1D) performs a CMP process to remove the hard mask layer 123 outside the trenches 114 and to planarize a top surface of the device 100 (FIG. 3C). As shown in FIG. 3C, the dummy gate 117 includes the hard mask layer 123 in this embodiment.

At operation 30, the method 10 (FIG. 1B) recesses the isolation layer 108 in the S/D regions 122. Referring to FIGS. 2M-2N and FIGS. 3C-3D, with the dummy gate 117 covering the fins 106 in the channel regions 116, the isolation layer 108 is etched in the S/D regions 122. The etching process may include a dry etching process, a wet etching process, or other suitable etching techniques. The etching process is tuned to selectively remove the isolation layer 108 while the dummy gate 117 and the fins 106 remain substantially unchanged. In the present embodiment, the epitaxial feature 106c protects the other layers of the fins 106 when the isolation layer 108 is etched. Subsequently, the epitaxial feature 106c is removed in another etching process (FIGS. 2O and 3E), exposing the epitaxial feature 106b for subsequent fabrication stages. The fins 106 may undergo various cleaning and drying processes after the isolation layer 108 and the epitaxial feature 106c are etched. For example, the fins 106 may be cleaned using a wet cleaning solution and then dried using a spin drying process. Since the fins 106 are supported by the dummy gate 117, they do not suffer from buckling and collapsing issues discussed earlier in the present disclosure. In fact, the fins 106 are supported by either the isolation layer 108 (FIGS. 2H and 3A) or the dummy gate 117 (FIGS. 2N-2O and 3D-3E) throughout the formation of the fins 106 in the channel and S/D regions. This advantageously improves the quality of the fins 106 over existing replacement gate processes.

Figure 2N:
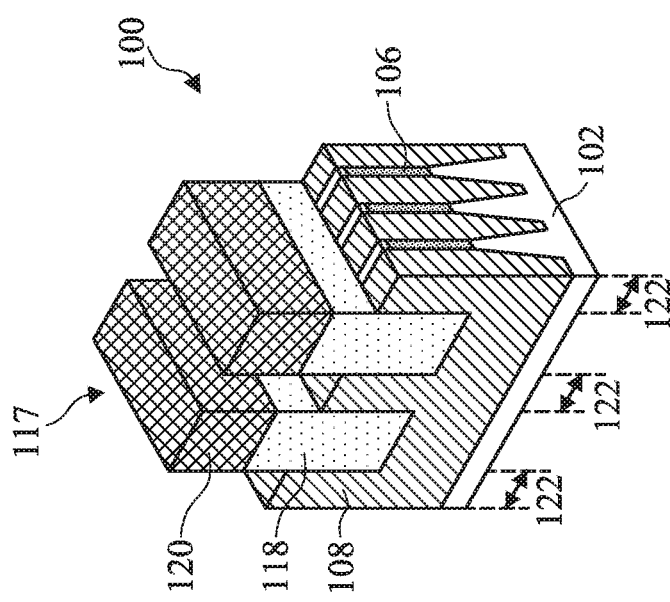

Furthermore, in embodiments of the present disclosure, the isolation layer 108 is etched in the channel regions 116 and in the S/D regions 122 separately. For example, the isolation layer 108 is etched in the channel regions 116 in operation 24 (FIGS. 1A and 2H) and is etched in the S/D regions 122 in operation 30 (FIGS. 1B, 2N, and 3D). Still further, in embodiments of the present disclosure, the isolation layer 108 is etched in the S/D regions 122 separately for P-type transistors and for N-type transistors. For example, the device 100 may be masked in regions for P-type transistors while the isolation layer 108 is etched in the S/D regions 122 for N-type transistors, and vice versa. The ability of etching the isolation layer 108 in selective regions (channel regions or S/D regions, for P-type transistors or N-type transistors) provides flexibility to the manufacturing process and many advantages to the device 100, which will be discussed in conjunction with FIGS. 4, 5A, and 5B in a later section.

At operation 32, the method 10 (FIG. 1B) optionally forms gate spacers 124 on sidewalls of the dummy gate 117 (FIG. 2P). For example, when the dummy gate 117 includes the poly silicon layer 118, the gate spacers 124 may be formed on sidewalls of the dummy gate 117 to protect the dummy gate 117 during various etching processes. In one example, the fins 106 in the S/D regions are etched to form recesses where epitaxial S/D features are subsequently grown. The poly silicon layer 118 may not have enough etching selectivity with respect to the fins 106. In such a case, the gate spacers 124 (e.g., a nitride) may act as a protection wall for the poly silicon layer 118 during the etching of the fins 106. In an embodiment, the gate spacers 124 may include silicon nitride and may be formed by a deposition and anisotropic etching (e.g., drying etching) process. In an embodiment, the isolation layer 108 may be etched deeper in the S/D regions 122 than in the channel regions 116 during operation 30. To further this embodiment, the gate spacers 124 extend deeper into the isolation layer 108 than the dummy gate 117. When the dummy gate 117 is replaced by a metal gate in a later step, the gate spacers 124 may more effectively prevent the metal material of the metal gate from intruding into the S/D regions 122 than a gate spacer that has the same depth as the dummy gate 117.

Figures 3E, 3F:
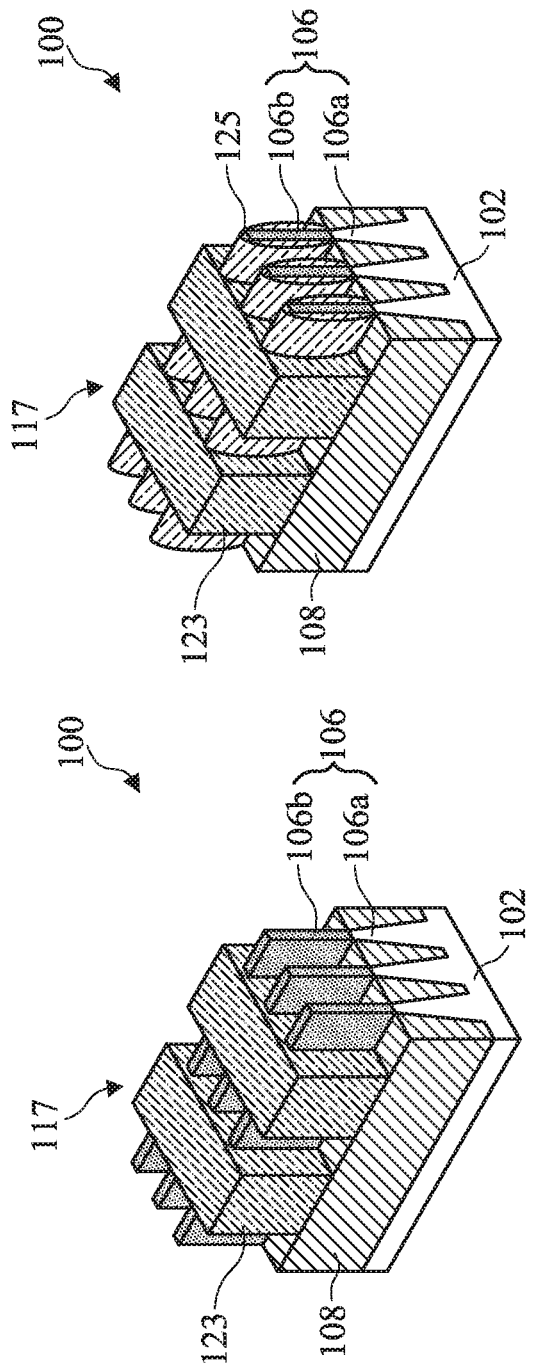

At operation 34, the method 10 (FIG. 1B) forms S/D features 125 over the fins 106 in the S/D regions 122. Referring to FIG. 3F, the S/D features 125 may be formed by one or more epitaxial growth processes. The S/D features 125 may include one or more semiconductor materials and may be heavily doped for reducing S/D contact resistance. Further, the method 10 may form S/D features 125 separately for P-type transistors and for N-type transistors. In an embodiment, the fins 106 may be recessed before the S/D features 125 are grown.

After the S/D features 125 are formed, the method 10 may form a contact etch stop (CES) layer covering the various portions of the device 100 and form an inter-layer dielectric (ILD) layer over the CES layer. The CES layer may include a dielectric material such as silicon nitride, silicon oxide, silicon oxynitride, and/or other materials. The CES layer may be formed by ALD, PECVD, or other suitable deposition or oxidation processes. The ILD layer may include materials such as tetraethylorthosilicate oxide, un-doped silicate glass, or doped silicon oxide such as borophosphosilicate glass, fused silica glass, phosphosilicate glass, boron doped silicon glass, and/or other suitable dielectric materials. The ILD layer may be deposited by a PECVD process, a flowable CVD (FCVD) process, or other suitable deposition technique.

At operation 36, the method 10 (FIG. 1B) replaces the dummy gate 117 with a final gate stack. In an embodiment, the final gate stack includes one or more metal layers, and is therefore referred to as a metal gate. For example, operation 36 may remove the dummy gate 117 using one or more etching processes and cleaning processes to form trenches in the device 100. The trenches expose the upper portions of the fins 106 in the channel regions 116 (see FIGS. 2H and 3A). Then, layers of the metal gate are deposited into the trenches and engaging the upper portions of the fins 106. In one example, the metal gate includes an interfacial layer, a gate dielectric layer, a work function metal layer, and a metal fill layer. The interfacial layer may include a dielectric material such as silicon oxide layer ($SiO_2$) or silicon oxynitride (SiON), and may be formed by chemical oxidation, thermal oxidation, ALD, CVD, and/or other suitable techniques. The gate dielectric layer may include a high-k dielectric layer such as hafnium oxide ($HfO_2$), zirconium oxide ($ZrO_2$), lanthanum oxide ($La_2O_3$), titanium oxide ($TiO_2$), yttrium oxide ($Y_2O_3$), strontium titanate ($SrTiO_3$), other suitable metal-oxides, or combinations thereof. The gate dielectric layer may be formed by ALD and/or other suitable methods. The work function metal layer may be a p-type or an n-type work function layer. The p-type work function layer may comprise titanium nitride (TiN), tantalum nitride (TaN), ruthenium (Ru), molybdenum (Mo), tungsten (W), platinum (Pt), or combinations thereof. The n-type work function layer may comprise titanium (Ti), aluminum (Al), tantalum carbide (TaC), tantalum carbide nitride (TaCN), tantalum silicon nitride (TaSiN), or combinations thereof. The work function metal layer may include a plurality of layers and may be deposited by CVD, PVD, and/or other suitable process. The metal fill layer may include aluminum (Al), tungsten (W), cobalt (Co), copper (Cu), and/or other suitable materials. The metal fill layer may be formed by CVD, PVD, plating, and/or other suitable processes.

At operation 38, the method 10 (FIG. 1B) proceeds to further steps to manufacture the device 100. For example, operation 38 may form S/D contacts electrically contacting the S/D features 125, form gate contacts electrically contacting the metal gate, and form metal interconnects connecting various active (e.g., transistors) and passive (e.g., resistors) devices of the device 100 to form a complete IC.

Figure 4:
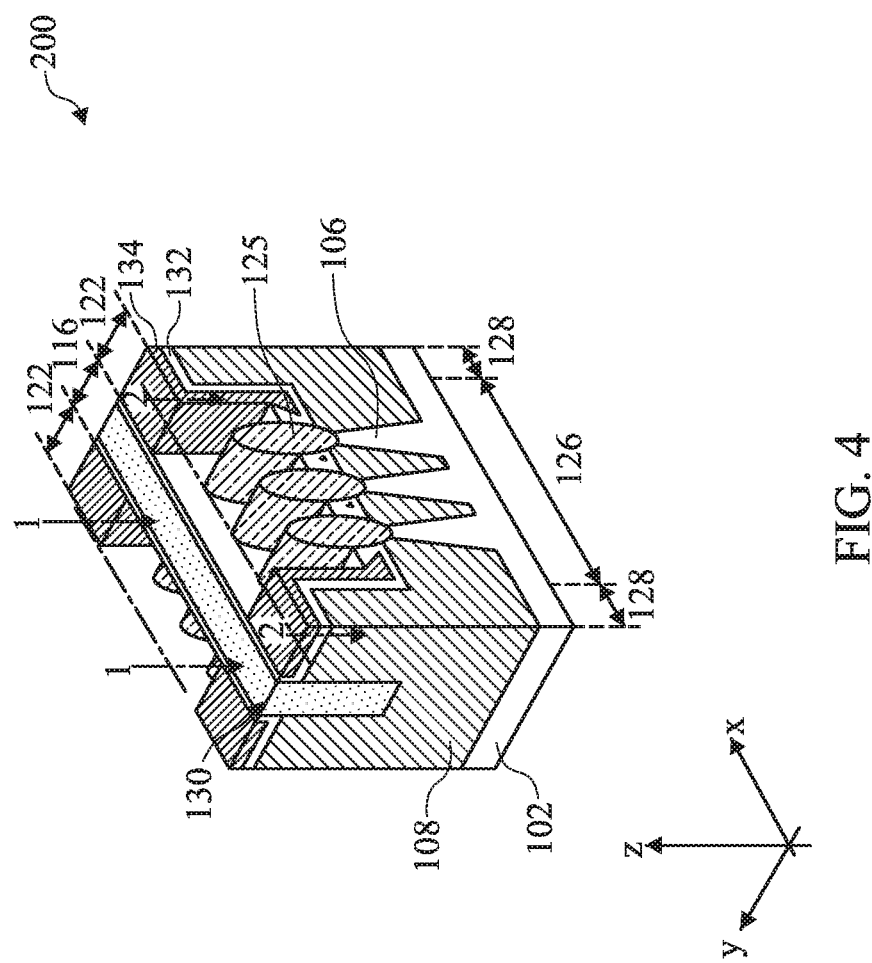
FIG. 4 is a perspective view of a portion of a semiconductor device fabricated with the method in FIGS. 1A-1D, in accordance to an embodiment.

FIG. 4 illustrates a semiconductor device 200 that is fabricated using embodiments of the method 10. Referring to FIG. 4, the device 200 includes a device region 126 and non-device regions 128. Transistors are formed in the device region 126, but not in the non-device regions 128. Many respects of the device 200 are the same as or similar to the device 100. For example, the device 200 includes a substrate 102, fins 106, an isolation layer 108, and S/D features 125 over the fins 106. In the device region 126, the fins 106 extend vertically (along the "z" direction) from the substrate 102 and through the isolation layer 108, and extend horizontally (in the "x-y" plane, along the "y" direction) through a channel region 116 and two S/D regions 122 of the device 200. A gate stack 130, which may be a metal gate, engages the fins 106 in the channel region 116. FIG. 4 further shows that the isolation layer 108 is lower in the device region 126 than in the non-device region 128. This may result from operations 24 and 30 (FIGS. 1A and 1B) where the isolation layer 108 is etched deeper in the channel and S/D regions of the device 200 and is etched shallower or not etched in the non-device regions 128. FIG. 4 further shows that a CES layer 132 is formed over the isolation layer 108 and an ILD layer 134 is formed over the CES layer 132.

Figures 5A, 5B:
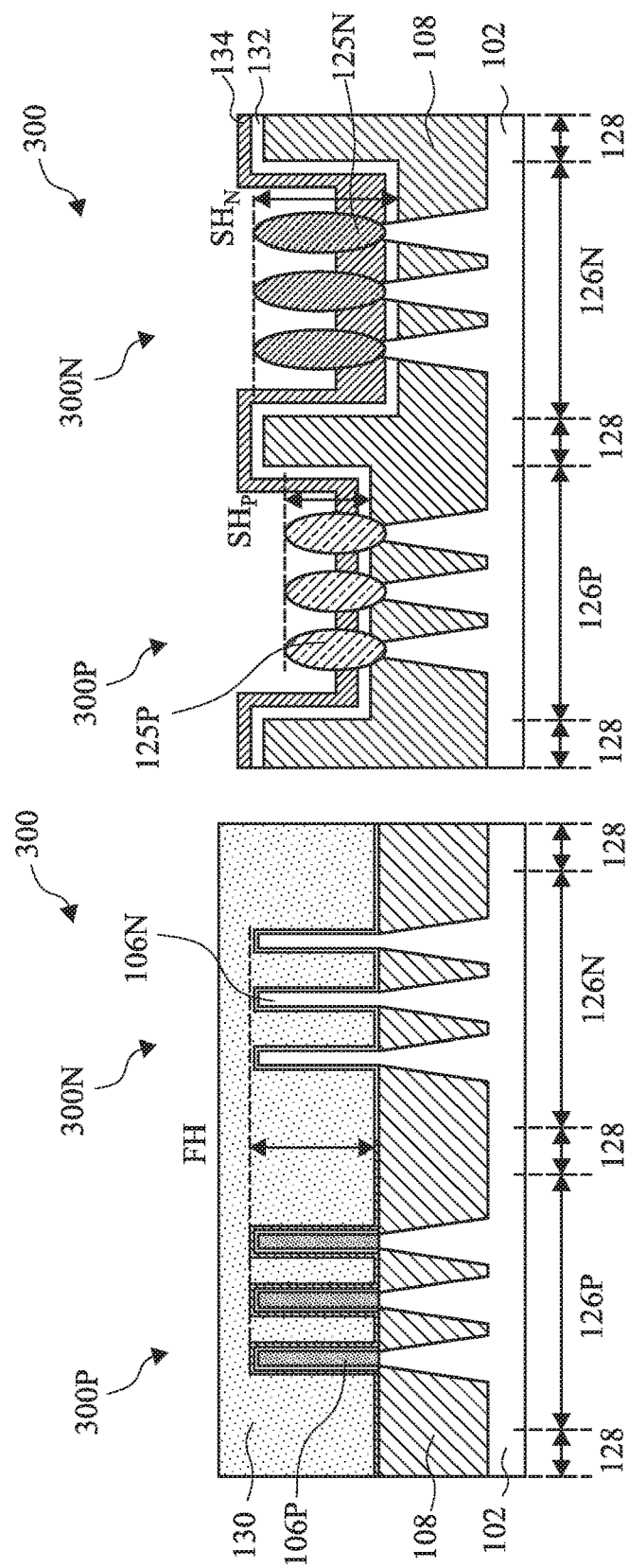
FIGS. 5A and 5B are cross-sectional views of portions of a semiconductor device fabricated with the method in FIGS. 1A-1D, in accordance to an embodiment.

FIGS. 5A and 5B show another device 300 that includes a P-type FINFET 300P and an N-type FINFET 300N. The P-type FINFET 300P and the N-type FINFET 300N may be embodiments of the device 200 (FIG. 4). In FIG. 5A, cross-sectional views of the P-type FINFET 300P and the N-type FINFET 300N, along the "1-1" line of FIG. 4 in the respective channel regions 116, are placed side-by-side for comparison purposes. In FIG. 5B, cross-sectional views of the P-type FINFET 300P and the N-type FINFET 300N, along the "2-2" line of FIG. 4 in the respective S/D regions 122, are placed side-by-side for comparison purposes.

Referring to FIG. 5A, the P-type FINFET 300P is formed in P-type device region 126P and includes P-type fins 106P, the N-type FINFET 300N is formed in N-type device region 126N and includes N-type fins 106N. The P-type device region 126P and the N-type device region 126N are separated by one or more non-device regions 128. The fins 106P and 106N have the same fin height FH in respective channel regions. In an embodiment, the fin height FH is 50 nanometer or higher. Further, the isolation layer 108 has the same height in the regions 126P, 126N, and 128.

Referring to FIG. 5B, the isolation layer 108 has different heights in the regions 126P, 126N, and 128, which may result from operation 30 (FIG. 1B). The isolation layer 108 is higher in the non-device regions 128 than in the device regions 126P and 126N. Accordingly, S/D features 125P of the P-type FINFET 300P and S/D features 125N of the N-type FINFET 300N may be grown to different heights, $SH_P$ and $SH_N$, respectively. The ability of separately tuning the heights of the S/D features for P-type and N-type transistors enables current spreading for certain fin heights.

Although not intended to be limiting, one or more embodiments of the present disclosure provide many benefits to a semiconductor device and a formation process thereof. For example, semiconductor fins are supported and protected during the formation of the fin (channel and S/D) in replacement gate process. This prevents the fins from buckling and collapsing, especially for fins with high aspect ratio. For another example, fin isolation layer may be etched to different depths in device regions versus non-device regions, and in P-type device regions versus N-type device regions. This provides flexibility of tuning the height of the fin S/D features.

In one exemplary aspect, the present disclosure is directed to a method of forming a semiconductor device. The method includes etching a substrate, thereby forming two first trenches separated by a fin; filling the two first trenches with an isolation layer; and depositing a dielectric layer over the fin and the isolation layer. The method further includes forming a second trench in the dielectric layer over a channel region of the semiconductor device, the second trench exposing the isolation layer. The method further includes etching the isolation layer through the second trench, thereby exposing an upper portion of the fin in the channel region of the semiconductor device; and forming a dummy gate in the second trench over the isolation layer and engaging the upper portion of the fin.

In another exemplary aspect, the present disclosure is directed to a method of forming a semiconductor device. The method includes etching a substrate to form first trenches interposed by fins; filling the first trenches with an isolation layer; depositing a dielectric layer over the fins and the isolation layer; and etching the dielectric layer, thereby forming second trenches in the dielectric layer over channel regions of the semiconductor device. The second trenches expose the isolation layer. The method further includes etching the isolation layer through the second trenches, thereby exposing upper portions of the fins in the channel regions of the semiconductor device. The method further includes forming dummy gates in the second trenches over the isolation layer, the dummy gates engaging the upper portions of the fins. The method further includes removing the dielectric layer and recessing the isolation layer in source/drain regions of the semiconductor device, while the dummy gates cover the channel regions of the semiconductor device.

In yet another exemplary aspect, the present disclosure is directed to a semiconductor device. The semiconductor device includes a device region and a non-device region. The device region includes a channel region and source/drain (S/D) regions for transistors. The semiconductor device comprises a substrate; an isolation layer over the substrate; and a fin element in the device region. The fin element extends vertically from the substrate and through the isolation layer, and extends horizontally in the channel and S/D regions. The semiconductor device further comprises a gate stack engaging the fin element in the channel region. The isolation layer is lower in the device region than in the non-device region.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a dielectric isolation layer disposed over a substrate;
a first fin structure disposed over the substrate and embedded within the dielectric isolation layer, wherein the dielectric isolation layer on a first side of the first fin structure has a first height and the dielectric isolation layer on a second side of the first fin structure has a second height;
a second fin structure disposed over the substrate and embedded within the dielectric isolation layer, wherein the dielectric isolation layer on a third side of the second fin structure has a third height and the dielectric isolation layer on a fourth side of the second fin structure has a fourth height, wherein the first height is different than the third height and the second height is different than the fourth height;
a first source/drain feature disposed on the first fin structure; and
an etch stop layer extending from the second fin structure to the first source/drain feature without extending to the first fin structure.

2. The device of claim 1, wherein the first fin structure is part of a p-type transistor and the second fin structure is part of an n-type transistor.

3. The device of claim 1, further comprising a second source/drain feature disposed on the second fin structure, the first source/drain feature having a first height and the second source/drain feature having a second height that is different than the first height.

4. The device of claim 1, further comprising a second source/drain feature disposed on the second fin structure, and
wherein the etch stop layer extending from the second fin structure to the first source/drain feature without extending to the second source/drain feature.

5. The device of claim 1, further comprising a third fin structure disposed over the substrate and embedded within the dielectric isolation layer, and
wherein the etch stop layer extends from the second fin structure to the third fin structure.

6. The device of claim 1, wherein the dielectric isolation layer includes a segment that extends continuously from the first fin structure to the second fin structure, wherein the segment includes a first portion having the second height, a second portion having the third height and a third portion having a fifth height, the third portion disposed between the first portion and the second portion, the fifth height being different than the second height and third height.

7. The device of claim 1, further comprising a gate structure disposed over the first fin structure and the second fin structure.

8. A device comprising:
a dielectric isolation layer disposed over a substrate;
a first semiconductor fin structure and a second semiconductor fin structure disposed over the substrate and at least partially embedded in the dielectric isolation layer, wherein the dielectric isolation layer on a first side of the first semiconductor fin structure has a first height and the dielectric isolation layer on a second side of the second semiconductor fin structure has a second height that is different than the first height; and
a first source/drain feature disposed on the first semiconductor fin structure and a second source/drain feature disposed on the second semiconductor fin structure, the first source/drain feature having a third height and the second source/drain feature having a fourth height that is different than the third height.

9. The device of claim 8, wherein the first semiconductor fin structure has a fifth height that is less than the first height of the dielectric isolation layer.

10. The device of claim 8, wherein a portion of the dielectric isolation layer physically contacts the first source/drain feature.

11. The device of claim 10, wherein the second source/drain feature is disposed on the second semiconductor fin structure without physically contacting the dielectric isolation layer.

12. The device of claim 8, wherein the second height is less than the first height.

13. The device of claim 8, the first semiconductor fin structure has a fifth height and the second semiconductor fin structure has a sixth height that is equal to the fifth height.

14. The device of claim 8, further comprising a dielectric layer disposed adjacent the first source/drain feature and the second source/drain feature such that the dielectric layer physically contacts the first source/drain feature and the second source/drain feature, and
wherein the dielectric layer adjacent the first source/drain feature has a first thickness and the dielectric layer adjacent the second source/drain feature has a second thickness that is different than the first thickness.

15. A device comprising:
an isolation layer disposed over a substrate;
a first fin structure and a second fin structure at least partially embedded within the isolation layer, the first fin structure having a first height and the isolation layer on a first side of the first fin structure having a second height that is greater than the first height, the second fin structure having the first height and the isolation layer on a second side of the second fin structure having a third height that is less than the first height;
a first source/drain feature disposed on the first fin structure and associated with a first transistor of a first type of conductivity, the first source/drain feature interfacing with the isolation layer; and
a second source/drain feature disposed on the second fin structure without interfacing with the isolation layer, the second source/drain feature associated with a second transistor of a second type of conductivity, the second type being opposite the first type.

16. The device of claim 15, wherein the first source/drain feature has a fourth height and the second source/drain feature has a fifth height that is greater than the fourth height.

17. The device of claim 15, wherein the first type of conductivity is an n-type of conductivity and wherein the second type of conductivity is a p-type of conductivity.

18. The device of claim 15, further comprising:
a high-k dielectric layer disposed over the first and second fin structures; and
a metal gate electrode disposed over the first and second fin structures.

19. The device of claim 15, wherein the isolation layer includes a portion discloses between the first source/drain feature and the second source/drain feature, the portion having a height greater than at least one of the first source/drain feature and the second source/drain feature.

20. The device of claim 15, wherein the isolation layer extends continuously from the first fin structure to the second fin structure.

* * * * *